United States Patent
Yamazaki

(10) Patent No.: US 11,277,924 B2
(45) Date of Patent: Mar. 15, 2022

(54) METHOD FOR MANUFACTURING MULTILAYER PRINTED WIRING BOARD AND MULTILAYER PRINTED WIRING BOARD

(71) Applicant: Fujikura Ltd., Tokyo (JP)

(72) Inventor: Akimi Yamazaki, Chiba (JP)

(73) Assignee: FUJIKURA LTD., Tokyo (JP)

(*) Notice: Subject to any disclaimer, the term of this patent is extended or adjusted under 35 U.S.C. 154(b) by 82 days.

(21) Appl. No.: 16/636,557

(22) PCT Filed: Jul. 30, 2018

(86) PCT No.: PCT/JP2018/028424
§ 371 (c)(1),
(2) Date: Feb. 4, 2020

(87) PCT Pub. No.: WO2019/026835
PCT Pub. Date: Feb. 7, 2019

(65) Prior Publication Data
US 2021/0161019 A1 May 27, 2021

(30) Foreign Application Priority Data
Aug. 4, 2017 (JP) .............................. JP2017-151524

(51) Int. Cl.
*H05K 1/00* (2006.01)
*H05K 1/02* (2006.01)
(Continued)

(52) U.S. Cl.
CPC ......... *H05K 3/4611* (2013.01); *H05K 1/0298* (2013.01)

(58) Field of Classification Search
CPC .. H05K 1/00; H05K 1/02; H05K 1/03; H05K 1/09; H05K 1/11; H05K 1/14; H05K 1/16;
(Continued)

(56) References Cited

U.S. PATENT DOCUMENTS 5,262,594 A * 11/1993 Edwin .................. H05K 3/3452
174/254
5,736,780 A * 4/1998 Murayama .............. H01L 23/24
257/673
(Continued)

FOREIGN PATENT DOCUMENTS

CN 1734756 A 2/2006
CN 101288351 A 10/2008
(Continued)

OTHER PUBLICATIONS

International Search Report issued in corresponding International Application No. PCT/JP2018/028424, dated Aug. 28, 2018 (3 pages).

Primary Examiner — Xiaoliang Chen
(74) Attorney, Agent, or Firm — Osha Bergman Watanabe & Burton LLP

(57) ABSTRACT

A method for manufacturing a multilayer printed wiring board includes: preparing a first wiring board that includes a circuit region formed with one or more signal lines on a main surface of a first insulating substrate; preparing a second wiring board that includes an electrically conductive layer on a main surface of a second insulating substrate; disposing a spacer at a position spaced apart from an outer edge of the circuit region by a predetermined distance along at least a part of the outer edge; disposing an adhesive layer on the circuit region so that a space is provided between the adhesive layer and the spacer; and laminating the first wiring
(Continued)

board and the second wiring board for thermocompression bonding.

4 Claims, 9 Drawing Sheets

(51) Int. Cl.
*H05K 1/03* (2006.01)
*H05K 1/09* (2006.01)
*H05K 1/11* (2006.01)
*H05K 1/14* (2006.01)
*H05K 1/16* (2006.01)
*H05K 1/18* (2006.01)
*H05K 3/00* (2006.01)
*H05K 3/32* (2006.01)
*H05K 3/34* (2006.01)
*H05K 3/36* (2006.01)
*H05K 3/42* (2006.01)
*H05K 3/46* (2006.01)
*H01L 21/02* (2006.01)
*H01L 21/48* (2006.01)
*H01L 21/60* (2006.01)
*H01L 21/67* (2006.01)
*H01L 21/68* (2006.01)
*H01L 23/02* (2006.01)
*H01L 23/12* (2006.01)
*H01L 23/16* (2006.01)
*H01L 23/48* (2006.01)
*H01L 23/52* (2006.01)
*H01L 23/498* (2006.01)
*H01L 23/538* (2006.01)

(58) Field of Classification Search
CPC .. H05K 1/18; H05K 3/00; H05K 3/32; H05K 3/34; H05K 3/36; H05K 3/42; H05K 3/46; H01L 21/02; H01L 21/48; H01L 21/60; H01L 21/67; H01L 21/68; H01L 23/02; H01L 23/12; H01L 23/16; H01L 23/48; H01L 23/52; H01L 23/498; H01L 23/538
USPC ....... 174/250, 251, 254, 255, 257, 258, 260, 174/261; 257/700, 778; 361/714, 722, 361/752, 761, 771
See application file for complete search history.

(56) References Cited

U.S. PATENT DOCUMENTS

| | | | |
|---|---|---|---|
| 7,975,378 B1 | 7/2011 | Dutta | |
| 8,031,474 B2* | 10/2011 | Ogawa | H05K 1/183 361/761 |
| 8,472,197 B2* | 6/2013 | Higashibata | H01L 23/473 361/722 |
| 10,477,683 B2* | 11/2019 | Baek | H05K 1/111 |
| 2002/0024408 A1* | 2/2002 | Iwata | H03H 9/58 333/191 |
| 2005/0057906 A1* | 3/2005 | Nakatani | H05K 3/4694 361/771 |
| 2005/0161823 A1* | 7/2005 | Jobetto | H01L 21/4857 257/758 |
| 2006/0032669 A1* | 2/2006 | Kawakami | H05K 1/147 174/261 |
| 2006/0033199 A1* | 2/2006 | Kawakami | H01L 23/467 257/700 |
| 2007/0000687 A1 | 1/2007 | Brist et al. | |
| 2007/0119617 A1* | 5/2007 | Hayashi | H01L 25/0657 174/260 |
| 2007/0128948 A1* | 6/2007 | Nakanishi | G06F 3/0412 439/660 |
| 2007/0161266 A1* | 7/2007 | Nishizawa | H01L 25/105 439/69 |
| 2008/0139013 A1* | 6/2008 | Tomura | H01R 12/00 439/65 |
| 2009/0237774 A1* | 9/2009 | Ito | G02F 1/16753 359/296 |
| 2010/0149768 A1* | 6/2010 | Takaike | H01L 23/5383 361/761 |
| 2010/0157550 A1* | 6/2010 | Nishikawa | H01L 24/83 361/752 |
| 2010/0170700 A1* | 7/2010 | Nakamura | H05K 3/4614 174/254 |
| 2010/0195967 A1* | 8/2010 | Wang | G02B 6/43 385/129 |
| 2010/0320622 A1* | 12/2010 | Machida | H01L 23/49822 257/778 |
| 2011/0042124 A1* | 2/2011 | Matsui | H05K 3/4632 174/157 |
| 2013/0153269 A1* | 6/2013 | Takahashi | H05K 1/115 174/254 |
| 2014/0340353 A1* | 11/2014 | Chen | H03K 17/962 345/174 |
| 2016/0113110 A1* | 4/2016 | Furusawa | H05K 3/4697 174/251 |
| 2017/0062992 A1* | 3/2017 | Fischeneder | H05K 1/142 |

FOREIGN PATENT DOCUMENTS

| | | |
|---|---|---|
| JP | H02185430 A | 7/1990 |
| JP | 2001210959 A | 8/2001 |
| JP | 2002064273 A | 2/2002 |
| JP | 2006186098 A | 7/2006 |
| JP | 2007335675 A | 12/2007 |
| JP | 2008311267 A | 12/2008 |
| JP | 2009010004 A | 1/2009 |
| JP | 2011-040607 A | 2/2011 |
| JP | 2011138890 A | 7/2011 |
| JP | 4943247 B2 | 5/2012 |
| KR | 10-2013-0064647 A | 6/2013 |
| WO | 2006035528 A1 | 4/2006 |

* cited by examiner

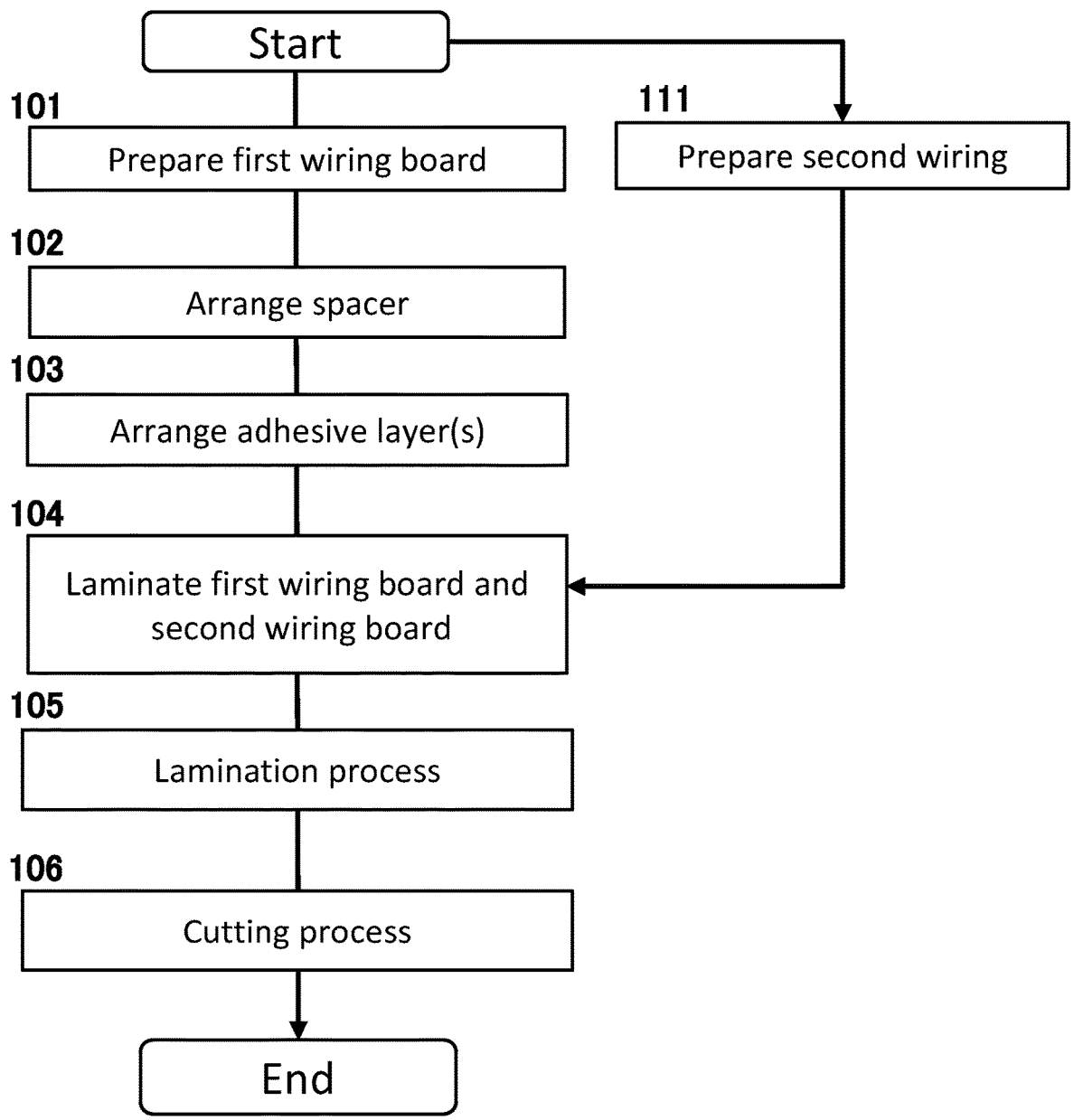

METHOD FOR MANUFACTURING MULTILAYER PRINTED WIRING BOARD AND MULTILAYER PRINTED WIRING BOARD

TECHNICAL FIELD

The present invention relates to a method for manufacturing a multilayer printed wiring board and a multilayer printed wiring board.

BACKGROUND

From the viewpoint of controlling the impedance of a transmission path, a printed wiring board having a microstrip line structure is known, in which an insulating resin layer embedded with a ground layer and an insulating resin layer embedded with a signal line are laminated via an adhesive layer (Patent Document 1).

PATENT DOCUMENT

[Patent Document 1] JP4943247B

However, in the manufacturing steps for a printed wiring board having a multilayer structure, when interlayer adhesion is performed by thermocompression bonding with an adhesive layer, the adhesive layer melts and the molten adhesive enters the gaps of a circuit of signal lines; therefore, the layer thickness changes from the initial state. Moreover, when pressure is applied under a high temperature in the thermocompression bonding step, the adhesive layer deforms, so that the thickness of the adhesive layer may deviate from the target design value or the thickness of the adhesive layer may vary. The change or variation in the thickness of the adhesive layer affects the distance between a signal line and an adjacent electrically conductive layer. The impedance changes depending on the distance between a signal line and an adjacent electrically conductive layer, and the change in the thickness of the adhesive layer and the uneven thickness hinder the manufacturing of a printed wiring board having impedance characteristics as initially designed.

SUMMARY

According to one or more embodiments of the present invention, a multilayer printed wiring board having impedance characteristics as initially designed in a method for manufacturing a multilayer printed wiring board including a thermocompression bonding step is manufactured.

(1) One or more embodiments of the present invention provide a method for manufacturing a multilayer printed wiring board. The method includes a step of preparing a first wiring board in which one or more signal lines are formed on a main surface of a first insulating substrate and a second wiring board in which an electrically conductive layer is formed on a main surface of a second insulating substrate. The second wiring board is to be laminated on the first wiring board. The method further includes a step of arranging a spacer at a position spaced apart from an outer edge of a circuit region by a predetermined distance along at least a part of the outer edge. The spacer has a predetermined thickness. The circuit region is formed with the one or more signal lines. The method further includes a step of forming an adhesive layer on the circuit region so that a space is provided between the adhesive layer and the spacer and a step of laminating the first wiring board and the second wiring board for thermocompression bonding. The predetermined distance is a distance that allows the space to be formed between the adhesive layer and the spacer after the step for thermocompression bonding.

(2) In the above invention, the predetermined thickness of the spacer can be calculated on the basis of a preliminarily set impedance of a transmission path including the one or more signal lines.

(3) In the above invention, the spacer may be arranged/set so as to surround the circuit region.

(4) In the above invention, the method may include a step of cutting a position between the spacer and the circuit region after the step for thermocompression bonding and a step of removing the spacer.

(5) In the above invention, the spacer may have a first adhesive layer that adheres to the first wiring board and/or a second adhesive layer that adheres to the second wiring board.

(6) In the above invention, the method may include cutting an outside of the spacer after the step for thermocompression bonding. The spacer is arranged/set so as to surround the circuit region along at least a part of the outer edge of the circuit region.

(7) One or more embodiments of the present invention provide a multilayer printed wiring board including a first wiring board in which one or more signal lines are formed on a main surface of a first insulating substrate, a spacer having a predetermined thickness and arranged/set along at least a part of an outer edge of a circuit region formed with the one or more signal lines, an adhesive layer covering at least the circuit region, a space formed between the spacer and the adhesive layer, and a second wiring board in which an electrically conductive layer is formed on a main surface of a second insulating substrate. The second wiring board is laminated via the adhesive layer on the first wiring board.

(8) In the above invention, the spacer may be formed along at least a part of the outer edge of the circuit region.

According to the method for manufacturing a multilayer printed wiring board of the present invention, a multilayer printed wiring board having the impedance as initially designed can be manufactured even through the thermocompression bonding step.

BRIEF DESCRIPTION OF THE DRAWINGS

FIG. 1B is a flowchart illustrating a method for manufacturing the multilayer printed wiring board.

DETAILED DESCRIPTION

Hereinafter, a method for manufacturing a multilayer printed wiring board according to one or more embodiments of the present invention will be described with reference to the drawings. The multilayer printed wiring board obtained by the manufacturing method according to one or more embodiments has a multilayer structure and has high flexibility.

Figure 1A:
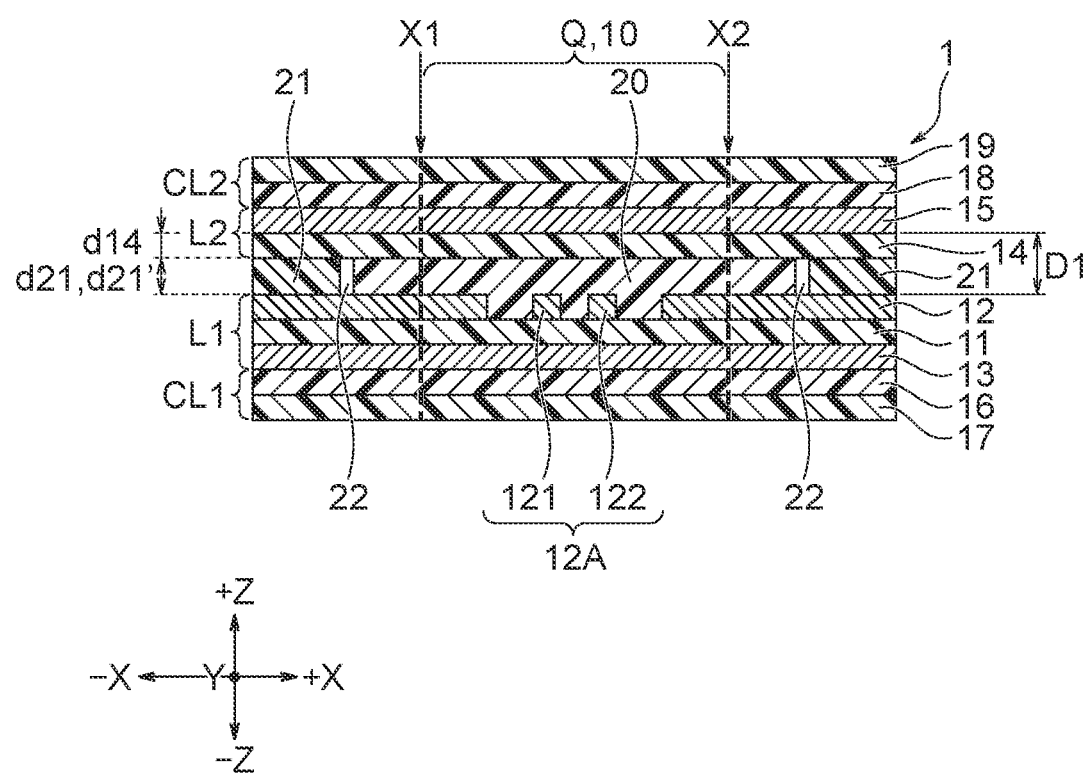
FIG. 1A is a cross-sectional view of a semifinished product of the multilayer printed wiring board obtained in the course of a manufacturing method according to one or more embodiments.

FIG. 1A illustrates a cross-sectional view of a semifinished product 1 of the multilayer printed wiring board obtained in the course of the manufacturing method according to one or more embodiments. The semifinished product 1 illustrated in FIG. 1A is in a state after the thermocompression bonding step (after the lamination process) and before the cutting step in the manufacturing steps for a multilayer printed wiring board 10. The multilayer printed wiring board 10 as a finished product is obtained by cutting out at least a product portion Q of the semifinished product 1 along the direction(s) of allows X1 and X2 as illustrated in FIG. 1A. The semifinished product 1 of the multilayer printed wiring board according to one or more embodiments has a first wiring board L1 and a second wiring board L2. The second wiring board L2 is laminated on the first wiring board L1. According to one or more embodiments, a method for manufacturing a multilayer printed wiring board will be described by exemplifying a basic structure in which two wiring boards are laminated, but the number of laminated wiring boards and the form thereof are not limited. Examples of the multilayer printed wiring board according to one or more embodiments include a partial multilayer printed wiring board in which the number of laminated layers is different at each portion. The multilayer printed wiring board 10 as a finished product is obtained by cutting out the portion corresponding to the region Q illustrated in FIGS. 1A and 1C from the multilayer printed wiring board illustrated in FIG. 1A (also see FIG. 1C, here and hereinafter).

The first wiring board L1 and the second wiring board L2 are laminated via an adhesive layer 20 and constitute the semifinished product 1 of the multilayer printed wiring board and the multilayer printed wiring board 10 as a finished product. The semifinished product 1 of the multilayer printed wiring board illustrated in FIG. 1A includes the multilayer printed wiring board 10 including a wiring board formed with a transmission path of a so-called stripline structure in which conductor foils are formed above and below signal lines 121 and 122 (i.e., on the upper and lower sides). The structure and form of the transmission path of the multilayer printed wiring board 10 as a finished product are not limited, and the multilayer printed wiring board 10 may be configured to include a transmission path of a microstrip line-type structure or a coplanar-type structure.

A first insulating substrate 11 and a second insulating substrate 14 are provided, which are polyimide (PI) sheet substrates having a thickness of 10 μm to 75 μm. Sheet substrates of an insulating material having flexibility, such as polyethylene terephthalate (PET), polyethylene naphthalate (PEN), or liquid crystal polymer (LCP), may also be used. The signal lines 121 and 122, a circuit layer 12, a first electrically conductive layer 13, and a second electrically conductive layer 15 are made of copper.

The first wiring board L1 according to one or more embodiments has the first insulating substrate 11, the circuit layer 12 which includes the signal lines 121 and 122 formed on one main surface (+Z-side surface) of the first insulating substrate 11, and the first electrically conductive layer 13 which is formed on the other main surface (−Z-side surface). The first wiring board L1 is produced through preparing a substrate having both surfaces to which electrically conductive layers are bonded and forming the circuit layer 12, which includes the signal lines 121 and 122, on one main surface of the substrate. The circuit layer 12 and the first electrically conductive layer 13 each include one or more signal lines and/or one or more grounds. The second wiring board L2 according to one or more embodiments has the second insulating substrate 14 and the second electrically conductive layer 15 which is formed on one main surface (+Z-side surface) of the second insulating substrate 14. The second electrically conductive layer 15 includes one or more signal lines and/or one or more grounds.

The surface of the first electrically conductive layer 13 of the first wiring board L1 is covered with a first coverlay CL1. The first coverlay CL1 has a first adhesive layer 16 and a first film layer 17. The first film layer 17 is laminated via the first adhesive layer 16 on the first electrically conductive layer 13. The exposed main surface of the second electrically conductive layer 15 of the second wiring board L2 is covered with a second coverlay CL2. The second coverlay CL2 has a second adhesive layer 18 and a second film layer 19. The second film layer 19 is laminated via the second adhesive layer 18 on the second electrically conductive layer 15. A film coverlay obtained by applying an adhesive to a polyimide film or a polyethylene terephthalate film is used as each of the first coverlay CL1 and the second coverlay CL2. A liquid solder resist may also be used as each of the first coverlay CL1 and the second coverlay CL2.

In one or more embodiments, a spacer 21 is arranged/set along at least a part of the outer edge of a circuit region 12A that is formed with the signal lines 121 and 122. The spacer 21 according to one or more embodiments may be formed along a part of the outer extension of the circuit region 12A or may also be formed along the entire circumference of the circuit region 12A (so as to surround the circuit region 12A). In one or more embodiments, the spacer 21 is arranged at a position spaced apart from the outer edge of the circuit region 12A by a predetermined distance. The spacer 21 is a member having a predetermined thickness, as will be described later. The spacer 21 is arranged to be spaced apart from the circuit region 12A by a predetermined distance so that a space 22 is formed between the inner surface of the spacer 21 facing the circuit region 12A side and the outer edge of the circuit region 12A. This predetermined distance may be set on the basis of experiment or may also be set by way of simulation. The form of the space 22 to be formed is not particularly limited. The predetermined distance between the spacer 21 and the circuit region 12A may be set so that the space 22 having a predetermined width is formed between the spacer 21 and the adhesive layer 20. Two or more spaces 22 may also be provided to exist intermittently (discontinuously/discretely) between the spacer 21 and the adhesive layer 20. The predetermined distance is set by way of experiment and/or simulation in accordance with the desired form of the space or spaces 22. As will be described later, when the semifinished product 1 of the multilayer printed wiring board after the thermocompression bonding step is provided with a space 22, formation of the adhesive layer 20 between the spacer 21 and the second insulating substrate 14 is suppressed, and a distance D1 that affects the impedance can be prevented from changing before and after the thermocompression bonding step. When the first wiring board L1 and the second wiring board L2 are laminated, the spacer 21 is interposed (laminated) between the first wiring board L1 and the second wiring board L2. In the example illustrated in FIG. 1A, the spacer 21 is arranged/set along the direction in which the signal lines 121 and 122 extend.

Examples of the material used for the spacer 21 include polyethylene terephthalate (PET), polyethylene naphthalate (PEN), polyimide (PI), and liquid crystal polymer (LCP). For the spacer 21 a material that does not deform even in the thermocompression bonding step may be used. A material common to the first insulating substrate 11 and the second insulating substrate 14 may also be used for the spacer 21.

The spacer 21 has a "predetermined thickness" that is preliminarily set. The "predetermined thickness" of the spacer 21 is determined on the basis of an impedance value that is preliminarily set for the transmission path including the signal lines 121 and 122. The impedance of the multilayer printed wiring board 10 as a finished product obtained by cutting out a partial region (product portion) from the semifinished product 1 of the multilayer printed wiring board illustrated in FIG. 1A is calculated using the distance between the transmission path including the signal lines 121 and 122 and an electrically conductive layer adjacent thereto via an insulating material, that is, the thickness of the insulating material. The impedance of the transmission path including the signal lines 121 and 122 of the multilayer printed wiring board 10 obtained from the semifinished product 1 of the multilayer printed wiring board having the structure illustrated in FIG. 1A may have to be calculated with consideration for at least the distance D1 from the circuit layer 12 to the second electrically conductive layer 15. A scheme known at the time of filing the present application can be used as the scheme for calculating the impedance. Software for simulation used for impedance calculation known at the time of filing the present application may also be used.

Specifically, the impedance of the transmission path including the signal lines 121 and 122 of the multilayer printed wiring board 10 obtained from the semifinished product 1 of the multilayer printed wiring board having the structure illustrated in FIG. 1A can be calculated using any one or more factors of the factor group consisting of the thickness and relative permittivity of the first insulating substrate 11, the thickness and relative permittivity of the second insulating substrate 14, the line width and thickness of the signal lines 121 and 122, and the thickness and relative permittivity of the adhesive layer 20. The impedance of the transmission path including the signal lines 121 and 122 is preliminarily determined, and if the thickness and relative permittivity of the first insulating substrate 11, the thickness and relative permittivity of the second insulating substrate 14, the line width and thickness of the signal lines 121 and 122, and the thickness and relative permittivity of the adhesive layer 20 can be preliminarily given in the multilayer printed wiring board 10, the distance D1 from the circuit layer 12 to the second electrically conductive layer 15 can be calculated. The distance D1 from the circuit layer 12 to the second electrically conductive layer 15 is the sum of a thickness $d21'$ of the adhesive layer 20 and a thickness $d14$ of the second insulating substrate 14 ($D1=d21'+d14$). The thickness $d21'$ of the adhesive layer 20 corresponds to a thickness $d21$ of the spacer, and the distance D1 is therefore the sum of the thickness $d21$ of the spacer 21 and the thickness $d14$ of the second insulating substrate 14 ($D1=d21+d14$).

From the above, the distance D1 and the thickness $d21'$ of the adhesive layer 20 can be calculated in the multilayer printed wiring board 10 obtained from the semifinished product 1 of the multilayer printed wiring board having the signal lines 121 and 122 which exhibit the set impedance. When the target value of the thickness $d21'$ of the adhesive layer 20 is determined in the multilayer printed wiring board 10 obtained from the semifinished product 1 of the multilayer printed wiring board, the thickness $d21$ of the spacer 21 for achieving that thickness can be derived. The thickness $d21$ of the spacer 21 is larger than the thickness of the signal lines 121 to 122 and is set to a thickness equal to the thickness $d21'$ (target value) of the adhesive layer 20 calculated so as to exhibit the impedance characteristics representing a design value that is preliminarily set, or a thickness obtained by adding or subtracting a predetermined value to or from the thickness $d21'$. The predetermined value to be added or subtracted can be experimentally determined in accordance with the material of the adhesive layer 20 to be used and the thermocompression bonding condition.

In one or more embodiments, when considering the impedance of the transmission path of the multilayer printed wiring board 10, focusing attention on the distance D1 is based on the knowledge that the variation in the thickness $d21'$ of the adhesive layer 20 which is a part of the distance D1 affects the impedance control. This is because the adhesive layer 20 deforms in the thermocompression bonding step performed in the manufacturing steps for the multilayer printed wiring board 10 and its thickness $d21'$ varies accordingly.

The deformation of the adhesive layer 20 due to the thermocompression bonding step affects the distance D1 between the circuit layer 12 and the second electrically conductive layer 15. The spacer 21 according to one or more embodiments has a predetermined thickness and serves as a support structure in the height direction of the multilayer printed wiring board 10. The spacer 21 regulates the thickness of the adhesive layer 20 so that the distance D1 is maintained between the upper surface (+Z-side surface) of the circuit layer 12 including the signal lines 121 and 121 and the lower surface (−Z-side surface) of the second electrically conductive layer 15. The thickness $d21$ of the spacer 21 does not change even through the thermocompression bonding step, and the thickness of the adhesive layer 20 can therefore be prevented from deviating from the design value due to the thermocompression bonding step.

Thus, the spacer 21 supports the adhesive layer 20 and suppresses a change in the distance D1 between the circuit layer 12 including the signal lines 121 and 122 and the second electrically conductive layer 15 even through the thermocompression bonding step. By maintaining the thickness of the adhesive layer 20, which deforms in the thermocompression bonding step, at a predetermined thickness (within an allowable range of the design value), the distance D1 between the circuit layer 12 and the second electrically conductive layer 15 calculated at the time of setting the impedance can be controlled within a set value range. The variation (value variation) in the distance D1 which affects the impedance of the transmission path including the signal lines 121 and 122 can be suppressed, and the impedance of the multilayer printed wiring board 10 obtained from the semifinished product 1 of the multilayer printed wiring board can therefore be prevented from deviating from the target value of the design value. As a result, it is possible to provide a method for manufacturing the multilayer printed wiring board 10 in which the impedance of the signal lines 121 and 122 can be controlled within the target value range.

By arranging the spacer 21 along at least a part of the outer edge of the circuit region 12A, the change in the distance D1 between the circuit layer 12 and the second electrically conductive layer 15 in the circuit region 12A including the signal lines 121 and 122 can be suppressed even through the thermocompression bonding step, and the variation (value variation) in the distance D1 which affects the impedance of the transmission path including the signal lines 121 and 122 can thus be suppressed.

The adhesive layer 20 according to one or more embodiments is formed in a region that includes at least the circuit region 12A formed with the signal lines 121 and 122. At least a partial region of the adhesive layer 20 is formed on the upper surface (surface along the insulating substrate 11) of the circuit region 12A. The adhesive layer 20 formed on the circuit region 12A covers the signal lines 121 and 122. At least a partial region of the adhesive layer 20 is formed between the circuit region 12A and the spacer 21. In a region facing the spacer 21, the space 22 is formed between the adhesive layer 20 and the spacer 21. The adhesive layer 20 has a region that faces the spacer 21 via the space 22. A sheet-like layer is used as the adhesive layer 20 according to one or more embodiments. A paste or liquid adhesive may also be used, such as by screen printing. In one or more embodiments, a layer having a structure in which release sheets are laminated on both surfaces is used. Any thermoplastic adhesive can be used, such as an epoxy-based adhesive, an acrylic-based adhesive, a polyimide-based adhesive, or a modified polyphenylene ether-based adhesive. The material for forming the adhesive layer 20 is not particularly limited, and a commercially available material as an interlayer adhesive can be used as appropriate. In one or more embodiments, a bonding sheet available from Arisawa Mfg. Co., Ltd. is used.

The adhesive layer 20 according to one or more embodiments is formed so that the space 22 is provided between the spacer 21 and the adhesive layer 20. The space 22 may exist before and after the thermocompression bonding step (the space 22 may be formed before or after the thermocompression bonding step). The space 22 may exist (may be formed) at a time point before the thermocompression bonding step or may also exist (may also be formed) at a time point after the thermocompression bonding step. By providing the space 22, the thickness of the adhesive layer 20 can be made equal to the thickness of the spacer 21. If the space 22 does not exist between the adhesive layer 20 and the spacer 21, the adhesive layer 20 may overflow from the space surrounded by the first insulating substrate 11, the signal lines 121 and 122, and the spacer 21 and enter a space between the spacer 21 and the second insulating substrate 14. In this case, the adhesive layer 20 is formed between the spacer 21 and the second insulating substrate 14, so that the distance D1 which affects the impedance changes before and after the thermocompression bonding step. When the space 22 exists between the adhesive layer 20 and the spacer 21, it can be confirmed that an event does not occur that the adhesive layer 20 overflows and enters a space between the spacer 21 and the second insulating substrate 14. In the step of arranging the spacer 21, the adhesive layer 20 and the spacer 21 are arranged so that the space 22 exists between the adhesive layer 20 and the spacer 21, and the distance D1 between the circuit layer 12 and the second electrically conductive layer 15 is maintained constant before and after the thermocompression bonding step. As a result, the change in the impedance value can be suppressed.

Figure 1C:
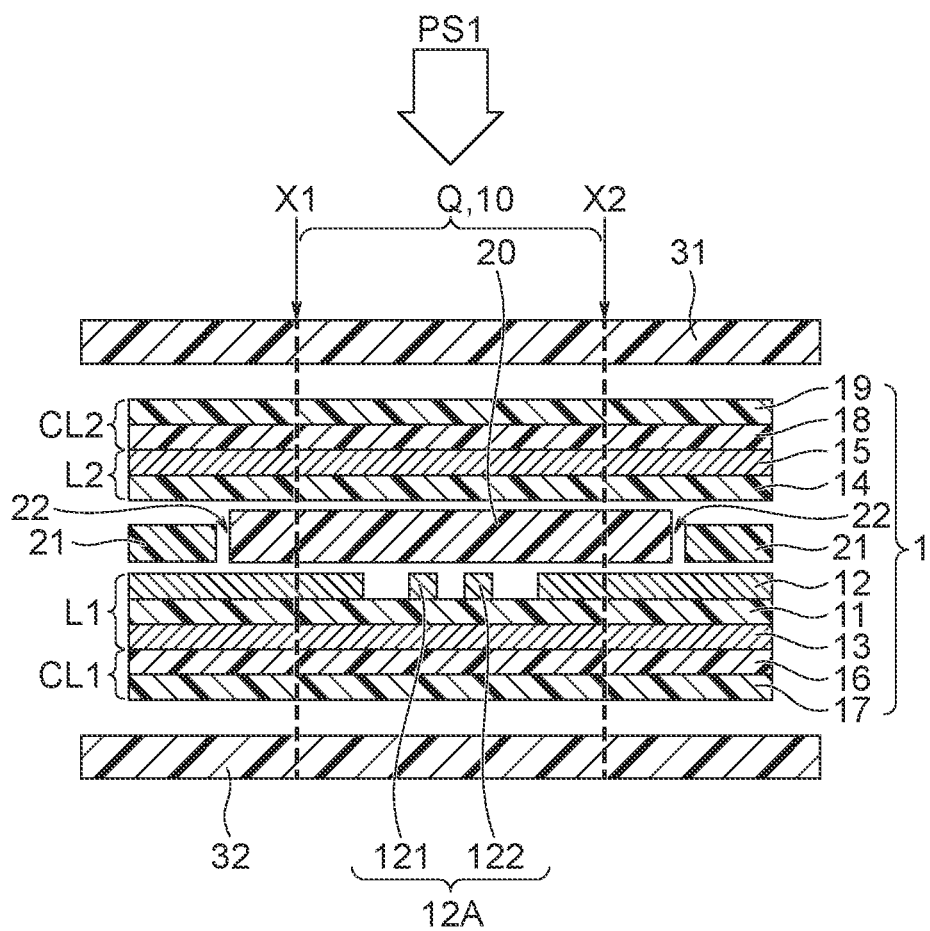
FIG. 1C is a diagram for describing the manufacturing steps for the multilayer printed wiring board.

Steps of a method for manufacturing the multilayer printed wiring board 10 according to one or more embodiments will then be described. FIG. 1B is a flowchart illustrating the steps of the method for manufacturing the multilayer printed wiring board 10, and FIG. 1C is a diagram for describing the steps. In FIG. 1C, each configuration of the multilayer printed wiring board 10 is illustrated exploded in the Z-axis direction so that each configuration can be identified. As previously described, in the semifinished product 1 of the multilayer printed wiring board illustrated in FIG. 1C, the product portion Q cut out from the semifinished product 1 becomes the multilayer printed wiring board 10 as a product.

As illustrated in FIGS. 1B and 1C, the first wiring board L1 is prepared in step 101, and the second wiring board L2 is prepared in step 111. One of these steps may be performed prior to the other, or both steps may also be performed in parallel. A double-sided copper-clad substrate is prepared, and the first wiring board L1 formed with the circuit layer 12 including the desired signal lines 121 and 122 is produced using a photolithography technique known at the time of filing the present application. The circuit layer 12 may be formed with wiring and/or one or more ground layers other than the signal lines 121 and 122. The first electrically conductive layer 13 is also formed with necessary wiring and/or one or more ground layers. On the other hand, a single-sided copper-clad substrate is prepared, and the second electrically conductive layer 15 is formed. The second electrically conductive layer 15 may include wiring or one or more ground layers. The scheme for forming the printed wiring board is not particularly limited. A method for manufacturing a printed wiring board known at the time of filing the present application can be used as appropriate, such as a subtractive method, an additive method, or a semi-additive method. To protect the first electrically conductive layer 13, the first coverlay CL1 is attached to the first electrically conductive layer 13. Likewise, the second coverlay CL2 is attached to the second electrically conductive layer 15 to protect the second electrically conductive layer 15.

In step 102, the spacer 21 is arranged on one main surface side (+Z-side in the figure) of the first wiring board L1. In this step, the spacer 21 having a predetermined thickness is arranged along at least a part of the outer edge of the circuit region 12A formed with the signal lines 121 and 122. The spacer 21 is arranged at a position spaced apart from the outer edge of the circuit region 12A by a predetermined distance. This predetermined distance is set so that, after the lamination process in the subsequent steps, the space 22 is formed between the spacer 21 and the cured adhesive layer 20. The thickness of the spacer 21 is calculated by the previously described scheme on the basis of the impedance which is preliminarily set.

In step 103, the adhesive layer 20 which covers at least the signal lines 121 and 122 is formed. The adhesive layer 20 is formed on the circuit region 12A provided with the signal lines 121 and 122. At this time, the size of the adhesive layer 20 is determined so that the space 22 (space corresponding to the space 22 after the lamination process) is formed between the adhesive layer 20 and the spacer 21. The adhesive layer 20 deforms in the subsequent thermocompression bonding step and flows into a space between the signal lines 121 and 122, and the thickness of the adhesive layer 20 changes. If the size of the adhesive layer 20 is determined so that the space 22 is formed even after the thermocompression bonding step, the molten adhesive layer 20 can be prevented from flowing onto the spacer 21. That is, the distance D1 from the signal lines 121 and 122 to the second electrically conductive layer 15 can be maintained constant during the step(s).

In step 104, the second wiring board L2 is laminated on the first wiring board L1. As illustrated in FIG. 1C, the spacer 21 and the adhesive layer 20 arranged on the first wiring board L1 are interposed between the first wiring board L1 and the second wiring board L2. At this stage, a temporary fixing step may be executed for temporarily fixing the first wiring board L1 and the second wiring board L2 using an iron.

In step 105, the first wiring board L1 and the second wiring board L2 are pressed from both sides in the lamination direction by a first pressing member 31 and a second pressing member 32 for thermocompression bonding. As illustrated in FIG. 1C, the first pressing member 31 is moved relatively in the direction of an arrow PS1 (−Z-direction in the figure), and the second pressing member 32 is moved relatively in the direction of an arrow PS2 (+Z-direction in the figure). The semifinished product 1 of the multilayer printed wiring board is pressed in the lamination direction by the first pressing member 31 and the second pressing member 32. The first pressing member 31 and the second pressing member 32 each have a built-in heating device. Cushion member(s) (Cushion materials) may be inserted between the first pressing member 31 and the second wiring board L2 and between the second pressing member 32 and the second wiring board L2. Using the first pressing member 31 and the second pressing member 32, the thermocompression bonding process (lamination process) for the first wiring board L1 and the second wiring board L2 is executed under the required heating/pressing condition. Although not particularly limited, in this example, the heating/pressing process for the thermocompression bonding is executed under the condition of 160 to 180 [° C.], 1 hour, and 30 to 50 [kgf]. In the course of this thermocompression bonding process, the adhesive layer 20 melts and flows into a space between the signal lines 121 and 122. The amount of the adhesive layer 20 is controlled so that the volume of the adhesive layer 20 is smaller than the volume of the space formed by the first wiring board L1, the second wiring board L2, and the spacer 21, and the space 22 is therefore formed between the adhesive layer 20 and the spacer 21. In the thermocompression bonding step, the adhesive of the adhesive layer 20 does not protrude onto the spacer 21 to affect the distance D1 between the circuit layer 12 and the second electrically conductive layer 15.

In the manufacturing method according to one or more embodiments, the thermocompression bonding step is performed in a state in which the spacer 21 is arranged; therefore, the spacer 21 serves as a support structure and the thickness of the adhesive layer 20 is prevented from deviating from the design value. It is thus possible to form a transmission path including the signal lines 121 and 122 which exhibit the impedance characteristics as designed even through the thermocompression bonding step.

Finally, in step 106, a cutting process for cutting out the product portion Q is performed. The cutting process is performed after the thermocompression bonding step. In the manufacturing method according to one or more embodiments, cutting is performed at a position that is on the circuit region 12A side of the arrangement position of the spacer 21 and that is outside the circuit region 12A. In the example illustrated in FIG. 1C, cutting is performed at a position that is inside the region formed with the spacer 21 (on the center side of the semifinished product 1 of the multilayer printed wiring board) and that is outside the circuit region 12A formed with the signal lines 121 and 122. That is, cutting is performed between the spacer 21 and the circuit region 12A.

In one or more embodiments, the product portion Q is cut out using a die. For the semifinished product 1 of the multilayer printed wiring board illustrated in FIG. 1C, the cutting edge of the die is brought into contact with the semifinished product 1 of the multilayer printed wiring board at positions X1 and X2 to cut out the product portion Q. This product portion Q is the multilayer printed wiring board 10 obtained by the manufacturing method according to one or more embodiments. The product portion Q including the signal lines 121 and 122 is cut out, and the spacer 21 can be removed from the product portion Q (multilayer printed wiring board 10). The spacer 21 is separated from the product portion Q (multilayer printed wiring board 10) and does not become a part of the product. That is, the spacer 21 is removed from the product portion Q. In the thermocompression bonding step, the spacer 21 is used as a support material, and in the die cutting step after the thermocompression bonding step, the spacer 21 is separated. The spacer 21 serves as a jig in the manufacturing steps and can prevent the design of the final product from being affected.

Figure 2A:
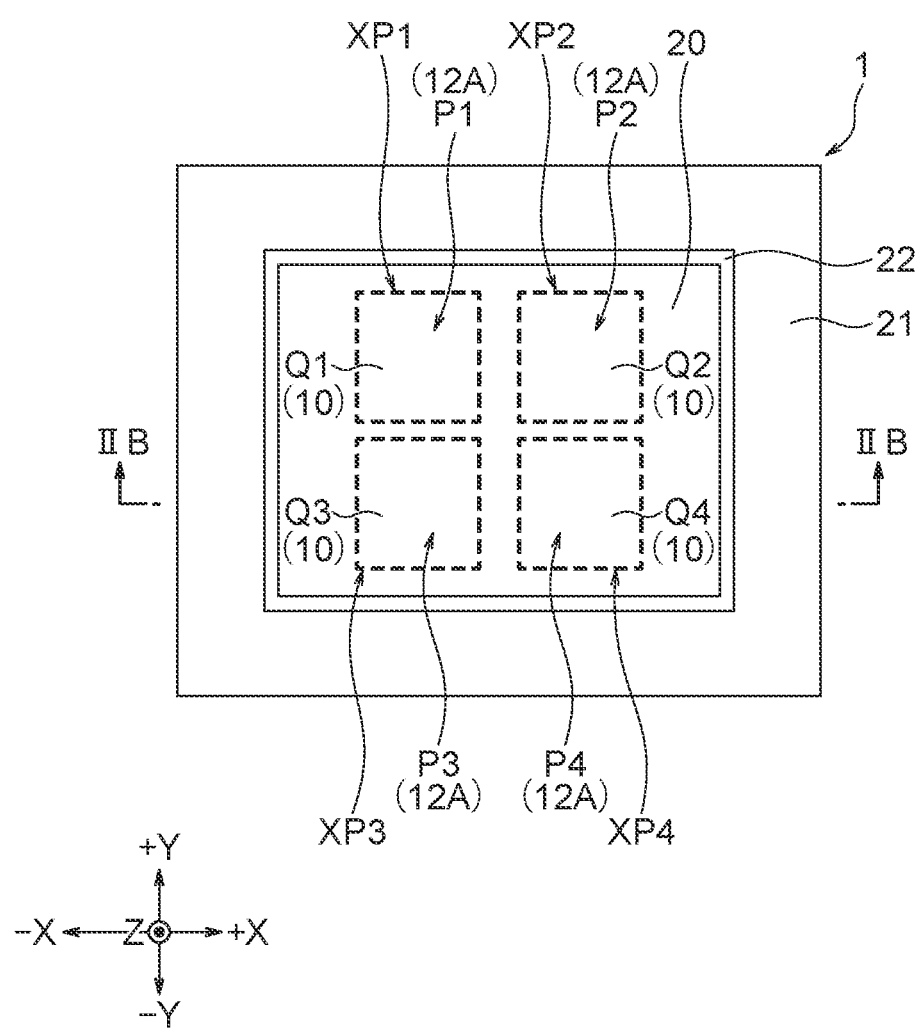
FIG. 2A is a plan view illustrating an arrangement example of a spacer according to one or more embodiments.
Figure 2B:
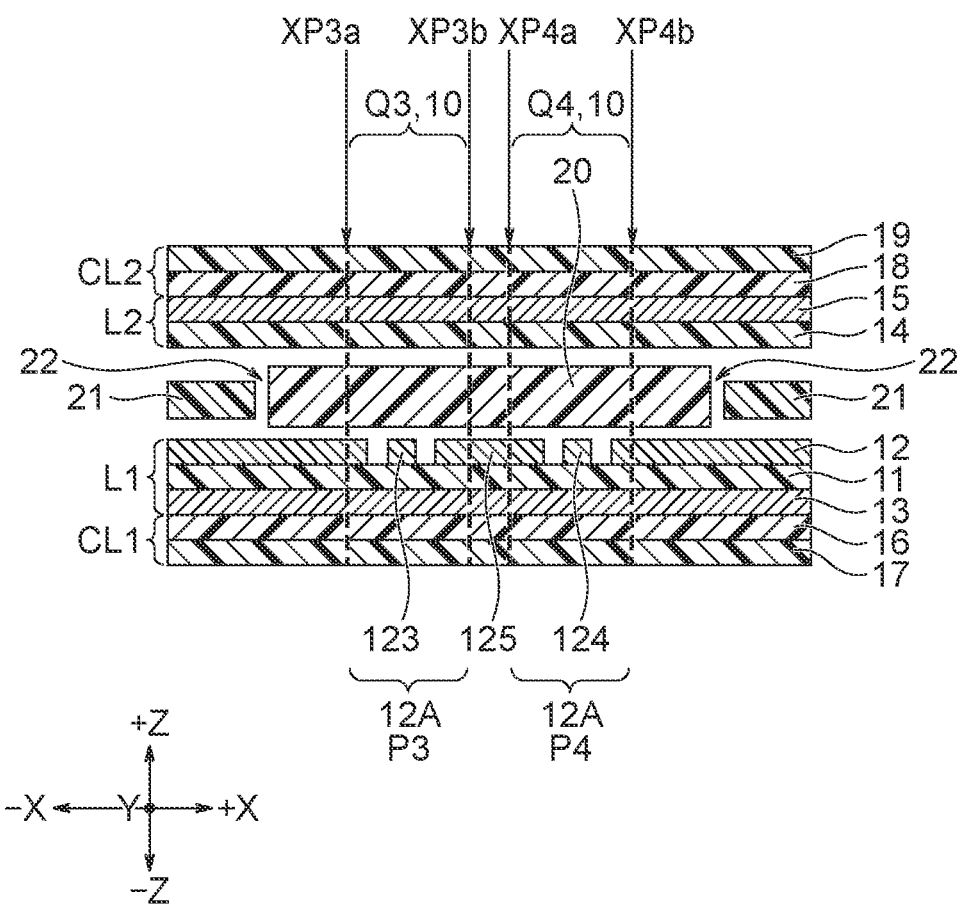
FIG. 2B is a cross-sectional view taken along line IIB-IIB illustrated in FIG. 2A.

With reference to FIGS. 2A and 2B, the method for manufacturing a multilayer printed wiring board according to one or more embodiments in which the arrangement form of a spacer 21 is different will be described. The steps in the manufacturing method of this example are common to the previously described steps. To avoid redundant description, the previous description will be borrowed herein for the description of the common steps, and the following description will focus on the different features.

With reference to FIG. 2A, the method for manufacturing a multilayer printed wiring board 10 according to one or more embodiments in which the arrangement form of the spacer 21 is different will be described. FIG. 2A is a plan view for describing an example of the arrangement form of the spacer 21, and FIG. 2B is a cross-sectional view taken along line IIB-IIB illustrated in FIG. 2A.

As illustrated in FIGS. 2A and 2B, this form is characterized in that the spacer 21 is formed so as to surround circuit regions P1 to P4. The circuit regions P1 to P4 are regions that are formed with signal lines 123, 124, and 125. The circuit regions P1 to P4 may also be regions that are formed with the signal lines 123, 124, and 125 and a module equipped with electronic components. FIGS. 2A and 2B illustrate an example in which multiple circuit regions P1 to P4 exist with the signal lines 123, 124, and 125 and the electronic components, but only one of the circuit regions P1 to P4 may exist.

In the example illustrated in FIGS. 2A and 2B, the spacer 21 is arranged so as to surround (encompass) the multiple circuit regions P1 to P4 formed with the circuits including the signal lines 123 to 125. The spacer 21 of this example is formed as a single body (continuous member). In this example, the spacer 21 having a rectangular frame shape surrounds the multiple circuit regions P1 to P4 from outside. The form of the spacer 21 is not limited to this, and the spacer 21 may be formed of two or more members. For example, spacers 21 may be arranged in a distributed manner at four vertex portions of a rectangular region that surrounds the circuit regions P1 to P4 from outside, or may also be arranged in a distributed manner at part of four sides of the rectangular region. Spacers may also be arranged in a distributed manner at the four vertex portions of a rectangle and part of the four sides. The adhesive layer 20 is formed so as to cover the circuit regions P1 to P4. A space 22 is formed between the adhesive layer 20 and the spacer 21. The thickness d21 of the spacer 21 is larger than the thickness of the signal lines 123 to 125 and is set to a thickness equal to a thickness d21' of the adhesive layer 20 calculated so as to exhibit the impedance characteristics representing a design value that is preliminarily set, or a thickness obtained by adding or subtracting a predetermined value to or from the thickness d21'. The predetermined value to be added or subtracted can be experimentally determined in accordance with the material of the adhesive layer 20 to be used and the thermocompression bonding condition.

Thus, the spacer 21 having a predetermined thickness, which is arranged along the outer edges of the circuit regions P1 to P4 formed with the signal lines 123, 124, and 125 so as to surround them, serves as a support structure in the thermocompression bonding step and prevents the thickness of the deformed adhesive layer 20 from deviating from a threshold that is allowed as a design value. The spacer 21 prevents a change in the distance D1 between the signal lines 123 to 124 and the second electrically conductive layer 15. The multilayer printed wiring board 10 can therefore be produced, which has the signal lines 123 to 125 exhibiting the impedance characteristics as designed even through the thermocompression bonding step.

As illustrated in FIGS. 2A and 2B, in this example, the cutting edges of dies are brought into contact with product portions Q1, Q2, Q3, and Q4 along XP1, XP2, XP3, and XP4 indicated by broken lines inside the spacer 21 and outside the circuit regions P1 to P4 and cut out the product portions Q1, Q2, Q3, and Q4. At this time, the spacer 21 outside the circuit regions P1 to P4 is removed. The spacer 21 does not become a part of the multilayer printed wiring board 10 as a product. The spacer 21 is removed in the die cutting step after the thermocompression bonding step and can therefore prevent the design of the product from being affected, while being used as a support material.

By arranging the spacer 21 so as to surround the circuit regions P1 to P4 formed with the signal lines 123 to 125 as in one or more embodiments, the effect of maintaining the impedance characteristics can be achieved on one hand while, on the other hand, a number of products can be obtained from one printed wiring board, and the products which satisfy the transmission characteristics can thus be manufactured at high productivity.

Figure 3A:
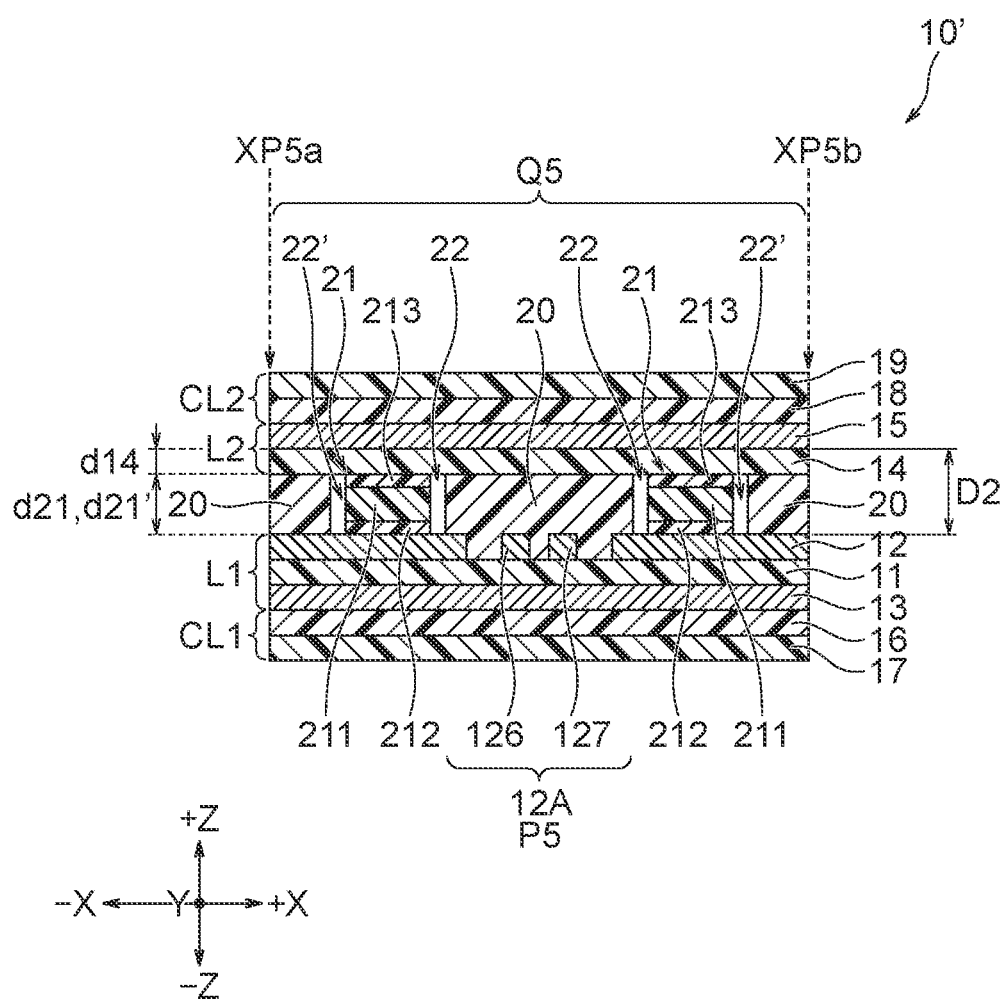
FIG. 3A is a cross-sectional view of the multilayer printed wiring board obtained by a manufacturing method according to one or more embodiments.
Figure 3B:
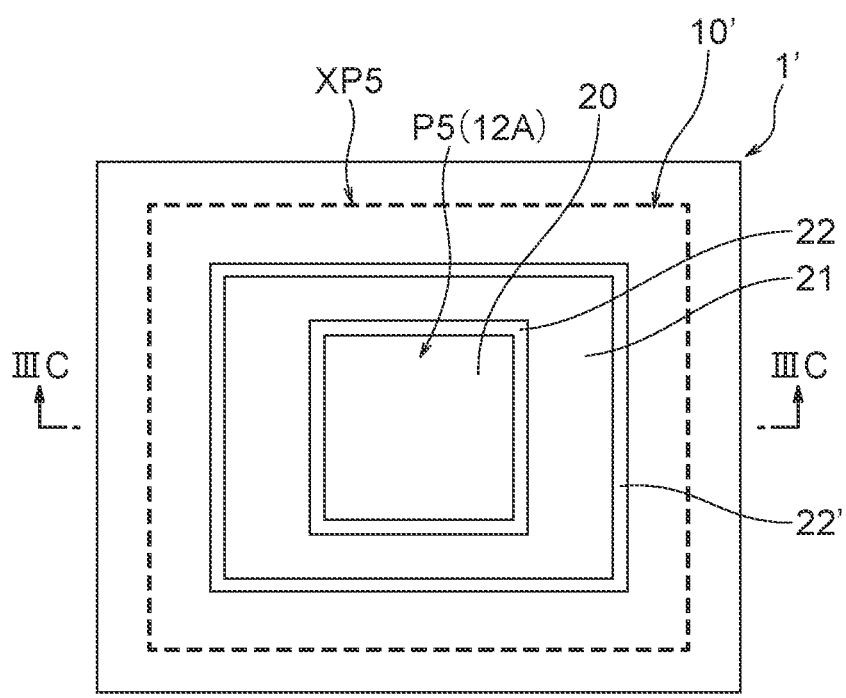
FIG. 3B is a plan view illustrating an arrangement example of a spacer in according to one or more embodiments.
Figure 3B:
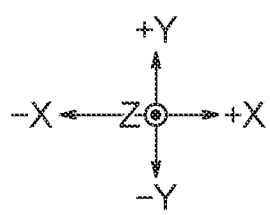
Figure 3C:
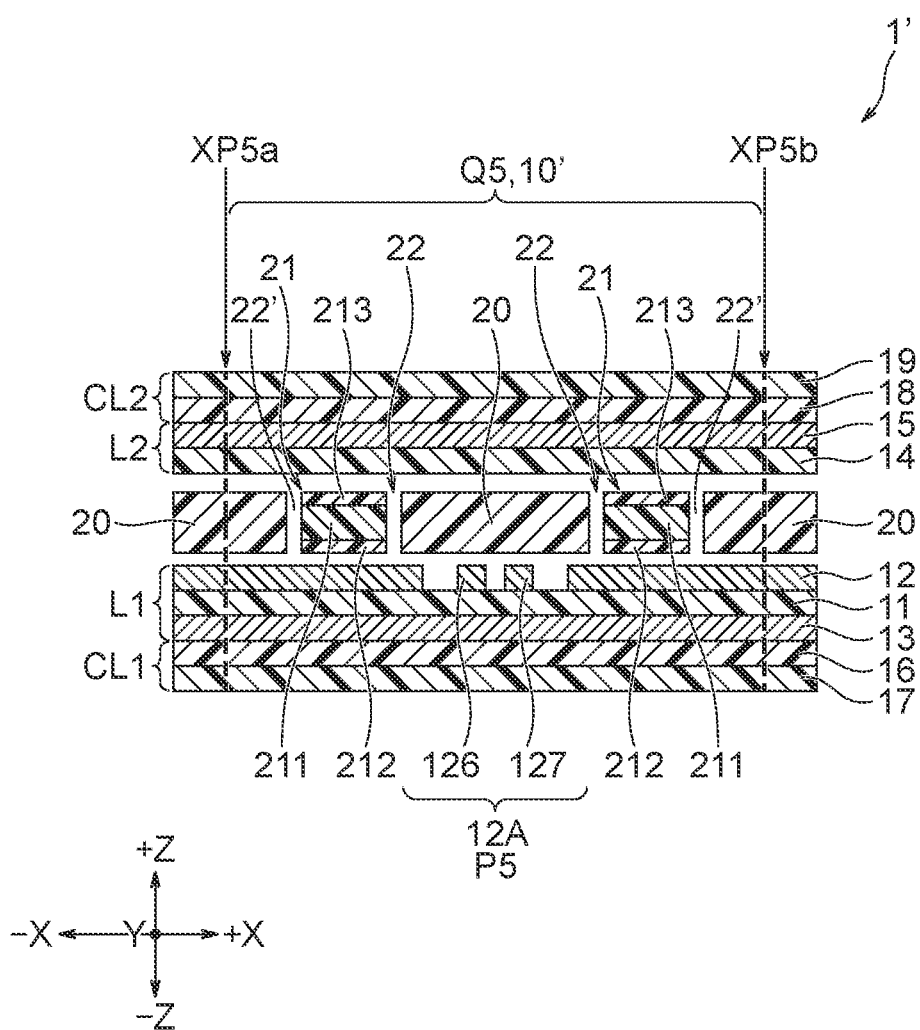
FIG. 3C is a cross-sectional view taken along line IIIC-IIIC illustrated in FIG. 3B.

The method for manufacturing a multilayer printed wiring board according to one or more embodiments of the present invention will be described below with reference to FIGS. 3A to 3C. FIG. 3A illustrates a multilayer printed wiring board 10' according to one or more embodiments. FIG. 3B is a plan view illustrating an arrangement example of the spacer in one or more embodiments. FIG. 3C illustrates a cross-sectional view of a semifinished product 1' of the multilayer printed wiring board obtained in the course of the manufacturing method according to one or more embodiments. The semifinished product 1' of the multilayer printed wiring board according to one or more embodiments and the multilayer printed wiring board 10' obtained from the semifinished product 1' have a multilayer structure and have high flexibility. Comparing the multilayer printed wiring board 10' corresponding to a product portion Q5 of the semifinished product 1' of the multilayer printed wiring board manufactured by the manufacturing method according to one or more embodiments with the multilayer printed wiring board 10 corresponding to the product portion Q of the semifinished product 1 of the multilayer printed wiring board according to the previously described embodiments, the multilayer printed wiring board 10' is characterized by including a spacer 21.

FIG. 3A illustrates a cross-sectional view of the multilayer printed wiring board 10' obtained by the manufacturing method according to one or more embodiments. The multilayer printed wiring board 10' according to one or more embodiments has a first wiring board L1 and a second wiring board L2. The second wiring board L2 is laminated on the first wiring board L1. In one or more embodiments, the multilayer printed wiring board 10' will be described by exemplifying a basic structure in which two wiring boards are laminated, but the number of laminated wiring boards and the form thereof are not limited. Examples of the multilayer printed wiring board 10' according to one or more embodiments include a partial multilayer printed wiring board in which the number of laminated layers is different at each portion.

The first wiring board L1 and the second wiring board L2 are laminated via adhesive layer(s) 20 and constitute the multilayer printed wiring board 10'. The multilayer printed wiring board 10' illustrated in FIG. 3A includes a wiring board formed with a transmission path of a so-called stripline structure in which conductor foils are formed above and below signal lines 126 and 127 (i.e., on the upper and lower sides). The structure and form of the transmission path are not limited, and the multilayer printed wiring board 10' may be configured to include a transmission path of a microstrip line-type structure or a coplanar-type structure.

The spacer 21 has a "predetermined thickness" that is preliminarily set. The "predetermined thickness" of the spacer 21 is determined on the basis of an impedance value that is preliminarily set for the transmission path including the signal lines 126 and 127. The impedance of the multilayer printed wiring board is calculated using the distance between the transmission path including the signal lines 126 and 127 and a conductive layer adjacent thereto via an insulating material, that is, the thickness of the insulating material. The impedance of the transmission path including the signal lines 126 and 127 of the multilayer printed wiring board 10' illustrated in FIG. 3A may have to be calculated with consideration for at least a distance D2 from the circuit layer 12 to the second electrically conductive layer 15. A scheme known at the time of filing the present application can be used as the scheme for calculating the impedance. Software for simulation used for impedance calculation known at the time of filing the present application may also be used.

The spacer 21 includes an insulating layer 211, a first adhesive layer 212, and a second adhesive layer 213. Examples of the material used for the insulating layer 211 include polyethylene terephthalate (PET), polyethylene naphthalate (PEN), polyimide (PI), and liquid crystal polymer (LCP). For the insulating layer 211 a material that does not deform even in the thermocompression bonding step may be used. A material common to the first insulating substrate 11 and the second insulating substrate 14 may also be used for the insulating layer 211. The material of the first adhesive layer 212 and second adhesive layer 213 is not particularly limited, and any thermoplastic adhesive can be used, such as an epoxy-based adhesive, an acrylic-based adhesive, a polyimide-based adhesive, or a modified polyphenylene ether-based adhesive.

The first wiring board L1 according to one or more embodiments has the first insulating substrate 11, the circuit layer 12 which includes the signal lines 126 and 127 formed on one main surface (+Z-side surface) of the first insulating substrate 11, and the first electrically conductive layer 13 which is formed on the other main surface (−Z-side surface). The first wiring board L1 is produced through preparing a substrate having both surfaces to which electrically conductive layers are bonded and forming the circuit layer 12, which includes the signal lines 126 and 127, on one main surface of the substrate. The circuit layer 12 and the first electrically conductive layer 13 each include one or more signal lines and/or one or more grounds. The second wiring board L2 according to one or more embodiments has the second insulating substrate 14 and the second electrically conductive layer 15 which is formed on one main surface (+Z-side surface) of the second insulating substrate 14. The second electrically conductive layer 15 includes one or more signal lines and/or one or more grounds.

The surface of the first electrically conductive layer 13 of the first wiring board L1 is covered with a first coverlay CL1. The first coverlay CL1 has a first adhesive layer 16 and a first film layer 17. The first film layer 17 is laminated via the first adhesive layer 16 on the first electrically conductive layer 13. The exposed main surface of the second electrically conductive layer 15 of the second wiring board L2 is covered with a second coverlay CL2. The second coverlay CL2 has a second adhesive layer 18 and a second film layer 19. The second film layer 19 is laminated via the second adhesive layer 18 on the second electrically conductive layer 15. The material and form of the first coverlay CL1 and the second coverlay CL2 are common to those in the previously described embodiments.

In one or more embodiments, the spacer 21 is arranged along at least a part of the outer edge of a circuit region 12A that is formed with the signal lines 126 and 127. The spacer 21 according to one or more embodiments may be formed along a partial outer extension of the circuit region 12A or may also be formed along the entire circumference of the circuit region 12A (so as to surround the circuit region 12A). When the first wiring board L1 and the second wiring board L2 are laminated, the spacer 21 is interposed between the first wiring board L1 and the second wiring board L2. In the example illustrated in FIG. 3A, the spacer 21 is arranged along the direction in which the signal lines 126 and 127 extend.

The spacer 21 has a "predetermined thickness" that is preliminarily set. The "predetermined thickness" of the spacer 21 is determined on the basis of an impedance value that is preliminarily set for the transmission path including the signal lines 126 and 127. The impedance of the multilayer printed wiring board is calculated using the distance between the transmission path including the signal lines 126 and 127 and a conductive layer adjacent thereto via an insulating material, that is, the thickness of the insulating material. The impedance of the transmission path including the signal lines 126 and 127 of the multilayer printed wiring board 10' illustrated in FIG. 3A may have to be calculated with consideration for at least a distance D2 from the circuit layer 12 to the second electrically conductive layer 15. A scheme known at the time of filing the present application can be used as the scheme for calculating the impedance. Software for simulation used for impedance calculation known at the time of filing the present application may also be used.

Specifically, the impedance of the transmission path including the signal lines 126 and 127 of the multilayer printed wiring board 10' having the structure illustrated in FIG. 3A can be calculated using any one or more factors of the factor group consisting of the thickness and relative permittivity of the first insulating substrate 11, the thickness and relative permittivity of the second insulating substrate 14, the line width and thickness of the signal lines 126 and 127, and the thickness and relative permittivity of the adhesive layers 20. The impedance of the transmission path including the signal lines 126 and 127 is preliminarily determined, and if the thickness and relative permittivity of the first insulating substrate 11, the thickness and relative permittivity of the second insulating substrate 14, the line width and thickness of the signal lines 126 and 127, the thickness and relative permittivity of the adhesive layers 20 can be preliminarily given in the multilayer printed wiring board 10', the distance D2 from the circuit layer 12 to the second electrically conductive layer 15 can be calculated. The distance D2 from the circuit layer 12 to the second electrically conductive layer 15 is the sum of a thickness d21' of the adhesive layers 20 and a thickness d14 of the second insulating substrate 14 (D2=d21'+d14). The thickness d21' of the adhesive layers 20 corresponds to a thickness d21 of the spacer, and the distance D2 is therefore the sum of the thickness d21 of the spacer 21 and the thickness d14 of the second insulating substrate 14 (D2=d21+d14).

From the above, the distance D2 and the thickness d21' of the adhesive layers 20 can be calculated in the multilayer printed wiring board 10' having the signal lines 126 and 127 which exhibit the set impedance. When the target value of the thickness d21' of the adhesive layers 20 in the multilayer printed wiring board 10' is determined, the thickness d21 of the spacer 21 for achieving that thickness can be derived. The thickness d21 of the spacer 21 is larger than the thickness of the signal lines 126 and 127 and is set to a thickness equal to the thickness d21' (target value) of the adhesive layers 20 calculated so as to exhibit the impedance characteristics representing a design value that is preliminarily set, or a thickness obtained by adding or subtracting a predetermined value to or from the thickness d21'. The predetermined value to be added or subtracted can be experimentally determined in accordance with the material of the adhesive layers 20 to be used and the thermocompression bonding condition.

In one or more embodiments, when considering the impedance of the transmission path of the multilayer printed wiring board 10', focusing attention on the distance D2 is based on the knowledge that the variation in the thickness d21' of the adhesive layers 20 which is a part of the distance D2 affects the impedance control. This is because the adhesive layers 20 deform in the thermocompression bonding step performed in the manufacturing steps for the multilayer printed wiring board 10' and the thickness d21' varies accordingly.

The deformation of the adhesive layers 20 due to the thermocompression bonding step affects the distance D2 between the circuit layer 12 and the second electrically conductive layer 15. The spacer 21 according to one or more embodiments has a predetermined thickness and serves as a support structure in the height direction of the multilayer printed wiring board 10'. The spacer 21 regulates the thickness of the adhesive layers 20 so that the distance D2 is maintained between the upper surface (+Z-side surface) of the circuit layer 12 including the signal lines 126 and 127 and the lower surface (−Z-side surface) of the second electrically conductive layer 15. The thickness d21 of the spacer 21 does not deform (the deformation amount is very small) even through the thermocompression bonding step, and the thickness of the adhesive layers 20 deformed due to the thermocompression bonding step can therefore be prevented from deviating from the design value as a target.

Thus, the spacer 21 supports the adhesive layers 20 and suppresses a change in the distance D2 between the circuit layer 12 including the signal lines 126 and 127 and the second electrically conductive layer 15 even through the thermocompression bonding step. By maintaining the thickness of the adhesive layers 20, which deform in the thermocompression bonding step, at a predetermined thickness, the variation in the distance D2 between the circuit layer 12 and the second electrically conductive layer 15 calculated at the time of setting the impedance can be controlled within a set value range. The variation in the distance D2 which affects the impedance of the transmission path including the signal lines 126 and 127 can be suppressed, and the impedance of the multilayer printed wiring board 10' can therefore be prevented from deviating from the target value of the design value. As a result, it is possible to provide a method for manufacturing the multilayer printed wiring board 10' in which the impedance of the signal lines 126 and 127 can be controlled within the target value range.

The adhesive layers 20 according to one or more embodiments are formed on the circuit region 12A formed with the signal lines 126 and 127. A sheet-like layer is used as each adhesive layer 20 according to one or more embodiments. A paste or liquid adhesive may also be used, such as by screen printing. In one or more embodiments, a layer having a structure in which release sheets are laminated on both surfaces is used. Any thermoplastic adhesive can be used, such as an epoxy-based adhesive, an acrylic-based adhesive, a polyimide-based adhesive, or a modified polyphenylene ether-based adhesive. The material for forming the adhesive layers 20 is not particularly limited, and a commercially available material as an interlayer adhesive can be used as appropriate. In one or more embodiments, bonding sheets available from Arisawa Mfg. Co., Ltd. are used.

The adhesive layers 20 according to one or more embodiments are formed so that spaces 22 and 22' are provided between the spacer 21 and the adhesive layers 20. The spaces 22 and 22' may exist before and after the thermocompression bonding step (the spaces 22 and 22' may be formed before or after the thermocompression bonding step). The spaces 22 and 22' may exist (may be formed) at a time point before the thermocompression bonding step or may also exist (may also be formed) at a time point after the thermocompression bonding step. By providing the spaces 22 and 22', a function can be obtained such that the thickness of the adhesive layers 20 can be made equal to the thickness of the spacer 21. If the spaces 22 and 22' do not exist between the adhesive layers 20 and the spacer 21, the adhesive layer 20 located inside may overflow from the space surrounded by the first insulating substrate 11, the signal lines 126 and 127, and the spacer 21 and enter a space between the spacer 21 and the second insulating substrate 14. In this case, the adhesive layer 20 is formed between the spacer 21 and the second insulating substrate 14, so that the distance D2 which affects the impedance changes before and after the thermocompression bonding step. When the spaces 22 and 22' exist between the adhesive layers 20 and the spacer 21, it can be confirmed that an event does not occur that the adhesive layers 20 overflow. The adhesive layers 20 and the spacer 21 are arranged so that the spaces 22 and 22' exist between the adhesive layers 20 and the spacer 21, and the distance D2 between the circuit layer 12 and the second electrically conductive layer 15 is maintained constant before and after the thermocompression bonding step. As a result, the change in the impedance value can be suppressed.

Steps of a method for manufacturing the multilayer printed wiring board 10' according to one or more embodiments will then be described. Basic steps of the manufacturing method are common to those of the previously described embodiments, so the flowchart of FIG. 1B which illustrates the steps of the method for manufacturing a multilayer printed wiring board is borrowed herein to describe the method for manufacturing the multilayer printed wiring board 10' according to one or more embodiments.

The method for manufacturing the multilayer printed wiring board 10' according to one or more embodiments will be described below with reference to FIGS. 1B, 3B, and 3C. The manufacturing method according to one or more embodiments is characterized by the arrangement form of the spacer 21 as compared with the previously described manufacturing method of the previously described embodiments. FIG. 3B is a diagram for describing the arrangement of the spacer 21, and FIG. 3C is a diagram for describing the steps. In FIG. 3C, each configuration of the multilayer printed wiring board 10' is illustrated exploded in the Z-axis direction so that each configuration can be identified. In the semifinished product 1' of the multilayer printed wiring board illustrated in FIG. 3C, a product portion Q5 that is cut out from the semifinished product 1' becomes the multilayer printed wiring board 10' as a product.

As illustrated in FIGS. 1B, 3B, and 3C, the first wiring board L1 is prepared in step 101, and the second wiring board L2 is prepared in step 111. One of these steps may be performed prior to the other, or both steps may also be performed in parallel. A double-sided copper-clad substrate is prepared, and the first wiring board L1 formed with the circuit layer 12 including the desired signal lines 126 and 127 is produced using a photolithography technique known at the time of filing the present application. The circuit layer 12 may be formed with wiring and/or one or more ground layers other than the signal lines 126 and 127. The first electrically conductive layer 13 is also formed with necessary wiring and/or one or more ground layers. On the other hand, a single-sided copper-clad substrate is prepared, and the second electrically conductive layer 15 is formed. The second electrically conductive layer 15 may include wiring or one or more ground layers. The scheme for forming the printed wiring board is not particularly limited. A method for manufacturing a printed wiring board known at the time of filing the present application can be used as appropriate, such as a subtractive method, an additive method, or a semi-additive method. To protect the first electrically conductive layer 13, the first coverlay CL1 is attached to the first electrically conductive layer 13. Likewise, the second coverlay CL2 is attached to the second electrically conductive layer 15 to protect the second electrically conductive layer 15.

In step 102, the spacer 21 is arranged on one main surface side (+Z-side in the figure) of the first wiring board L1. In this step, the spacer 21 having a predetermined thickness is arranged along at least a part of the outer edge of the circuit region 12A formed with the signal lines 126 and 127. The spacer is arranged at a position spaced apart from the outer edge of the circuit region 12A by a predetermined distance along at least a part of the outer edge of the circuit region 12A including the circuit layer 12 which includes the signal lines 126 and 127. This predetermined distance is set so that, after the compression bonding step in the subsequent step 105, the spaces are formed between the adhesive layers 20 and the spacer 21. The thickness of the spacer 21 is calculated by the previously described scheme on the basis of the impedance which is preliminarily set.

FIG. 3B is a plan view for describing an arrangement form of the spacer 21 in the method for manufacturing the multilayer printed wiring board 10' according to one or more embodiments, and FIG. 3C is a cross-sectional view taken along line IIIC-IIIC illustrated in FIG. 3B.

As illustrated in FIGS. 3B and 3C, in one or more embodiments, the spacer 21 is formed so as to surround a circuit region P5. The circuit region P5 is a region that is formed with the signal lines 126 and 127. The circuit region P5 may also be a region that is formed with the signal lines 126 and 127 and a module equipped with electronic components. FIGS. 3A and 3B illustrate an example in which only one circuit region P5 formed with the signal lines 126 to 127 and the electronic components exists, but two or more circuit regions P5 may exist.

In the example illustrated in FIGS. 3A and 3B, the spacer 21 is arranged so as to surround (encompass) the circuit region P5. The spacer 21 of this example is formed as a single body (continuous member). In this example, the spacer 21 having a rectangular frame shape surrounds the circuit region P5 from outside. The form of the spacer 21 is not limited to this, and the spacer 21 may be formed of two or more members. For example, spacers 21 may be arranged in a distributed manner at four vertex portions of a rectangle or may also be arranged in a distributed manner at part of four sides of a rectangle. Spacers may also be arranged in a distributed manner at the four vertex portions of a rectangle and part of the four sides.

The spacer 21 according to one or more embodiments includes the first adhesive layer 212 which adheres to the first wiring board L1 and the second adhesive layer 213 which adheres to the second wiring board L2. A polyimide sheet formed with a thermosetting adhesive on one side or both sides is used as the spacer 21 according to one or more embodiments. This allows the spacer 21 to adhere to and to be fixed to the first wiring board L1 and the second wiring board L2.

The adhesive layers 20 are formed so as to cover the circuit region P5. The spaces 22 and 22' are formed between the adhesive layers 20 and the spacer 21 both on the inside and outside of the spacer 21. The thickness d21 of the spacer 21 is larger than the thickness of the signal lines 126 and 127 and is set to a thickness equal to the thickness d21' of the adhesive layers 20 calculated so as to exhibit the impedance characteristics representing a design value that is preliminarily set, or a thickness obtained by adding or subtracting a predetermined value to or from the thickness d21'. The predetermined value to be added or subtracted can be experimentally determined in accordance with the material of the adhesive layers 20 to be used and the thermocompression bonding condition.

Thus, the spacer 21 having a predetermined thickness, which is arranged along the outer edge of the circuit region P5 formed with the signal lines 126 to 127 so as to surround them, serves as a support structure in the thermocompression bonding step and prevents the adhesive layers 20 from deforming due to pressing. The spacer 21 prevents a change in the distance D2 between the signal lines 126 and 127 and the second electrically conductive layer 15 (i.e., the spacer 21 prevents the distance D2 from deviating from a design threshold as a target). The multilayer printed wiring board 10' can therefore be produced, which has the signal lines 126 and 127 exhibiting the impedance characteristics as designed even through the thermocompression bonding step.

In step 103 of FIG. 1B, the adhesive layers 20 which cover at least the signal lines 126 and 127 are formed. The adhesive layers 20 are formed on the circuit region 12A provided with the signal lines 126 and 127. At this time, the sizes of the adhesive layers 20 are determined so that the spaces 22 and 22' are formed between the adhesive layers 20 and the spacer 21 on the inside and outside of the spacer 21. The adhesive layers 20 deform in the subsequent thermocompression bonding step and flow into a space between the signal lines 126 and 127, and the thickness of the adhesive layers 20 changes. If the sizes of the adhesive layers 20 are determined so that the spaces 22 and 22' are formed even after the thermocompression bonding step, the molten adhesive layers can be prevented from flowing onto the spacer 21. That is, the distance D2 from the signal lines 126 and 127 to the second electrically conductive layer 15 can be maintained constant during the step(s).

In step 104, the second wiring board L2 is laminated on the first wiring board L1. As illustrated in FIG. 3C, the spacer 21 and the adhesive layers 20 arranged on the first wiring board L1 are interposed between the first wiring board L1 and the second wiring board L2. At this stage, a temporary fixing step may be executed for temporarily fixing the first wiring board L1 and the second wiring board L2 using an iron.

In step 105, the first wiring board L1 and the second wiring board L2 are brought close to each other along the Z-direction in the figure and subjected to the thermocompression bonding. As in the previously described embodiments, using pressing members each having a built-in heating device, the thermocompression bonding process (lamination process) is executed by pressing the first wiring board L1 and the second wiring board L2 to each other along the lamination direction. In the course of this thermocompression bonding process, the adhesive layer 20 located inside melts and flows into a space between the signal lines 126 and 127. The amount of the adhesive layers 20 is controlled so that the volume of the adhesive layer 20 located inside is smaller than the volume of a space formed by the first wiring board L1, the second wiring board L2, and the spacer 21; therefore, the space 22 is formed between the spacer 21 and the adhesive layer 20 located inside and the space 22' is formed between the spacer 21 and the adhesive layer 20 located outside. In the thermocompression bonding step, the adhesive of the adhesive layers 20 does not protrude onto the spacer 21 to affect the distance D2 between the circuit layer 12 and the second electrically conductive layer 15.

In the manufacturing method according to one or more embodiments, the thermocompression bonding step is performed in a state in which the spacer 21 is arranged; therefore, the spacer 21 serves as a support structure and the deformation of the adhesive layers 20 is suppressed. It is thus possible to form a transmission path including the signal lines 126 and 127 which exhibit the impedance characteristics as designed even through the thermocompression bonding step.

Finally, in step 106, a cutting process for cutting out the product portion Q5 is performed. The cut-out product portion Q5 is the multilayer printed wiring board 10' obtained by the manufacturing method according to one or more embodiments. The cutting process is performed after the thermocompression bonding step. In the manufacturing method according to one or more embodiments, cutting is performed at a position that is on the outside of the circuit region 12A and that is on the outside of the arrangement position of the spacer 21. In the example illustrated in FIG. 3C, cutting is performed at a position that is on the outside of the circuit region 12A formed with the signal lines 126 and 127 and that is on the outside of the region formed with the spacer 21 (on the outer edge side of the multilayer printed wiring board 10'). The product portion Q5 which includes the signal lines 126 and 127 and the spacer 21 is cut out. In one or more embodiments, the spacer 21 becomes a part of the product portion Q5.

In one or more embodiments, the product portion Q5 is cut out using a die. In the method for manufacturing a multilayer printed wiring board according to one or more embodiments, the cutting edge of the die is brought into contact with the semifinished product 1' of the multilayer printed wiring board at positions XP5a and XP5b to cut out the product portion Q5. In the cutting process according to one or more embodiments, as illustrated in FIGS. 3B and 3C, cutting is performed along XP5 (XP5a, XP5b) on the outside of the spacer 21, which surrounds the circuit region P5, to cut out the product portion Q5. At this time, the spacer 21 is not cut out together with the circuit region P5. The spacer 21 is removed from the product portion Q5. The cut-out product portion Q5 corresponds to the multilayer printed wiring board 10' according to one or more embodiments illustrated in FIG. 3A. The spacer 21 according to one or more embodiments is a part of a product (multilayer printed wiring board 10'). The spacer 21 can be arranged in the vicinity of the signal lines 126 and 127, and the circuit region P5 can therefore be prevented from deforming due to the thermocompression bonding step. Thereafter, also in the steps until incorporation into the product, a change in the distance D2 between the circuit layer 12 including the signal lines 126 and 127 and the second electrically conductive layer 15 is suppressed, and it is thus possible to form a transmission path including the signal lines 126 and 127 which exhibit the impedance characteristics as designed even through the thermocompression bonding step and the assembly step.

In one or more embodiments, when the thickness d21 of the spacer 21 is calculated on the basis of the impedance, the thickness d21 of the spacer 21 of the multilayer printed wiring board 10' is calculated for achieving the impedance which is set with consideration for the thickness and relative permittivity of the spacer 21 (including the first adhesive layer 212 and the second adhesive layer 213).

Figure 4:
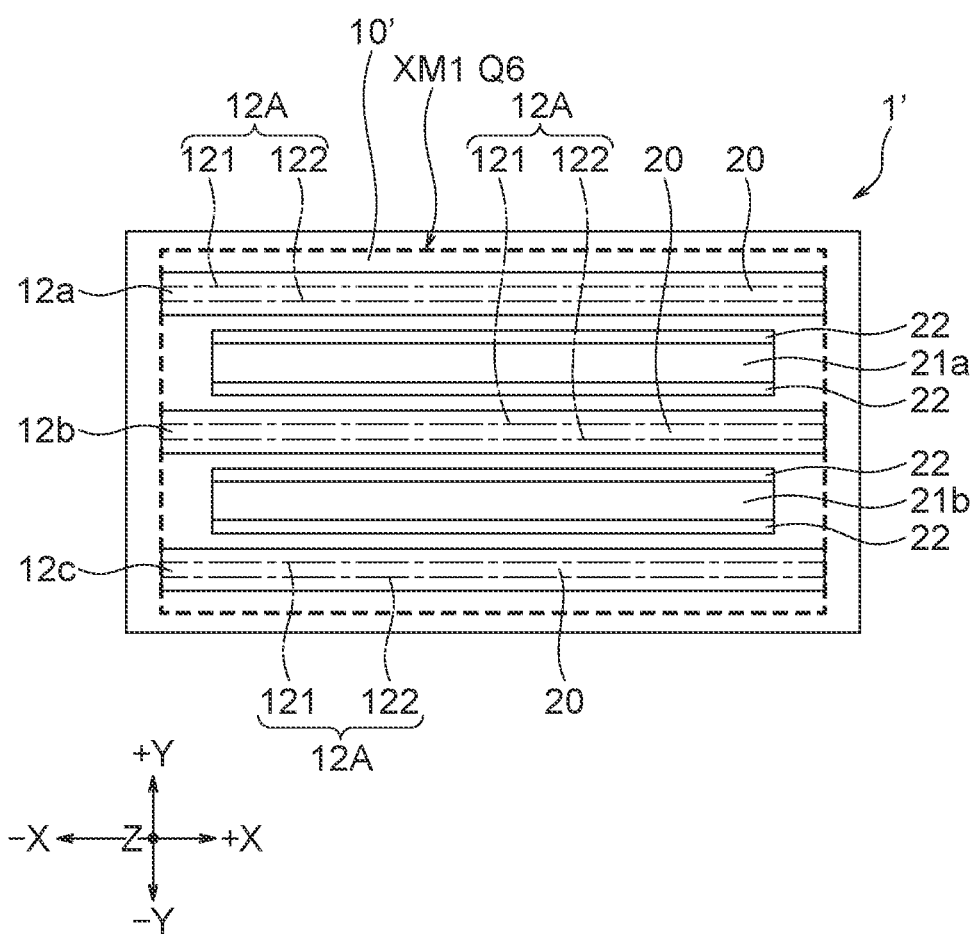
FIG. 4 is a plan view illustrating an arrangement example of spacers according to one or more embodiments.

FIG. 4 is a plan view for describing an example of the arrangement form of spacers 21 in the method for manufacturing a multilayer printed wiring board 10' according to one or more embodiments. FIG. 4 is a view when the first wiring board L1 having circuit regions 12a, 12b, and 12c is viewed in a plan view. Signal lines 121 and 122 indicated by broken lines are formed in each of the circuit regions 12a, 12b, and 12c.

In the example illustrated in FIG. 4, a spacer 21a is arranged along at least a part of the outer edge of the circuit region 12a or 12b. A spacer 21b is arranged along at least a part of the outer edge of the circuit region 12b or the circuit region 12c. The spacers 21a and 21b illustrated in the figure have a length substantially equal to that of the signal lines 121 and 122, but the length of the spacers 21a and 21b may be shorter than that of the signal lines 121 and 122. In the figure, single continuous spacer 21a, 21b is illustrated, but short spacers may be arranged in a distributed manner (as illustrated by dotted lines/broken lines). Adhesive layers 20 are formed on the circuit regions 12a, 12b, and 12c. Respective spaces 22 are formed between the spacer 21a and the circuit region 12a, between the spacer 21a and the circuit region 12b, between the spacer 21b and the circuit region 12b, and between the spacer 21b and the circuit region 12c.

The thickness of the spacers 21a and 21b in this example is larger than the thickness of the signal lines 121 and 122 and corresponds to the thickness of the adhesive layers 20 calculated so as to exhibit the impedance characteristics representing a design value that is preliminarily set.

Thus, the spacers 21a and 21b having a predetermined thickness are arranged along the outer edges of the circuit regions 12A formed with the signal lines 121 and 122 and the thermocompression bonding step is executed; therefore, the spacers 21a and 21b serve as a support structure and the adhesive layers 20 can be prevented from being unduly deformed. The spacers 21a and 21b prevent a change in the distance D1 between the signal lines 121 and 122 and the second electrically conductive layer 15. It is thus possible to form a transmission path including the signal lines 121 and 122 which exhibit the impedance characteristics as designed even through the thermocompression bonding step.

When the spacers 21 are arranged in the form illustrated in FIG. 4, the spacers 21a and 21b are formed between the multiple circuit regions 12a, 12b, and 12c. In this example, cutting is performed along a broken line XM1 illustrated in FIG. 4. The cutting edge of a die is brought into contact with a product portion Q6 along XM1 to cut out the product portion Q6, and a multilayer printed wiring board 10 including the spacers 21a and 21b is obtained.

Although the disclosure has been described with respect to only a limited number of embodiments, those skilled in the art, having benefit of this disclosure, will appreciate that various other embodiments may be devised without departing from the scope of the present invention. Accordingly, the scope of the invention should be limited only by the attached claims.

REFERENCE SIGNS LIST 1, 1' Semifinished product of multilayer printed wiring board
10, 10' Multilayer printed wiring board
L1 First wiring board
11 First insulating substrate
12 Circuit layer
12A, 12a, 12b, 12c Circuit region
P1 to P4 Circuit region
121, 122, 123, 124, 125, 126, 127 Signal line
13 First electrically conductive layer
L2 Second wiring board
14 Second insulating substrate
15 Second electrically conductive layer
CL1 First coverlay
16 First adhesive layer
17 First film layer
CL2 Second coverlay
18 Second adhesive layer
19 Second film layer
20 Adhesive layer
21 Spacer
211 Insulating layer
212 First adhesive layer (of spacer)
213 Second adhesive layer (of spacer)
22, 22' Space
31 First pressing member
32 Second pressing member
Q, Q1 to Q6 Product portion

The invention claimed is:

1. A method for manufacturing a multilayer printed wiring board, comprising:
preparing a first wiring board that comprises a circuit region formed with one or more signal lines on a main surface of a first insulating substrate;
preparing a second wiring board that comprises an electrically conductive layer on a main surface of a second insulating substrate;
disposing a spacer at a position spaced apart from an outer edge of the circuit region by a predetermined distance along at least a part of the outer edge, wherein the spacer has a predetermined thickness;

disposing an adhesive layer on the circuit region so that a space is provided between the adhesive layer and the spacer; and laminating the first wiring board and the second wiring board for thermocompression bonding, wherein the predetermined distance allows the space to be formed between the adhesive layer and the spacer after thermocompression bonding, and the predetermined thickness of the spacer is calculated based on a preliminarily set impedance of a transmission path that includes the one or more signal lines.

2. The method according to claim 1, wherein the spacer surrounds the circuit region.

3. A method for manufacturing a multilayer printed wiring board, comprising:

preparing a first wiring board that comprises a circuit region formed with one or more signal lines on a main surface of a first insulating substrate;

preparing a second wiring board that comprises an electrically conductive layer on a main surface of a second insulating substrate;

disposing a spacer at a position spaced apart from an outer edge of the circuit region by a predetermined distance along at least a part of the outer edge, wherein the spacer has a predetermined thickness;

disposing an adhesive layer on the circuit region so that a space is provided between the adhesive layer and the spacer;

laminating the first wiring board and the second wiring board for thermocompression bonding;

cutting the first wiring board and the second wiring board between the spacer and the circuit region after thermocompression bonding; and removing the spacer, wherein the predetermined distance allows the space to be formed between the adhesive layer and the spacer after thermocompression bonding.

4. A method for manufacturing a multilayer printed wiring board, comprising:

preparing a first wiring board that comprises a circuit region formed with one or more signal lines on a main surface of a first insulating substrate;

preparing a second wiring board that comprises an electrically conductive layer on a main surface of a second insulating substrate;

disposing a spacer at a position spaced apart from an outer edge of the circuit region by a predetermined distance along at least a part of the outer edge, wherein the spacer has a predetermined thickness;

disposing an adhesive layer on the circuit region so that a space is provided between the adhesive layer and the spacer;

laminating the first wiring board and the second wiring board for thermocompression bonding; and cutting an outside of the spacer after thermocompression bonding, wherein the predetermined distance allows the space to be formed between the adhesive layer and the spacer after thermocompression bonding, the spacer comprises at least one of a first adhesive layer that adheres to the first wiring board and a second adhesive layer that adheres to the second wiring board, and the spacer surrounds the circuit region along at least a part of the outer edge of the circuit region.

* * * * *